United States Patent [19]

Germer

[11] Patent Number: 4,571,692

[45] Date of Patent: Feb. 18, 1986

[54] ELECTRONIC DEMAND REGISTER

[75] Inventor: Warren R. Germer, Dover, N.H.

[73] Assignee: General Electric Company, Somersworth, N.H.

[21] Appl. No.: 599,684

[22] Filed: Apr. 12, 1984

[51] Int. Cl.[4] .................... G01R 19/16; G06F 15/20
[52] U.S. Cl. ............................ 364/483; 324/103 R; 324/116; 364/482; 364/492
[58] Field of Search ............... 364/482, 483, 492, 493, 364/480, 141, 184, 900 MS File; 324/103 R, 116

[56] References Cited

U.S. PATENT DOCUMENTS

| | | | |
|---|---|---|---|
| 3,890,494 | 6/1975 | Meshek et al. | 364/184 X |
| 3,913,014 | 10/1975 | Halstead et al. | 324/103 R |
| 4,179,654 | 12/1979 | Germer | 364/483 X |
| 4,229,795 | 10/1980 | Vieweg et al. | 324/103 R X |
| 4,301,508 | 11/1981 | Anderson et al. | 324/116 X |
| 4,419,737 | 12/1983 | Yamaura et al. | 364/900 |

Primary Examiner—Felix D. Gruber
Assistant Examiner—Heather R. Herndon
Attorney, Agent, or Firm—Robert E. Brunson; Thomas R. Morrison

[57] ABSTRACT

An electronic demand register includes a processor for calculating a demand in a demand subinterval. At the end of each demand subinterval, the calculated demand is summed with the demand in the preceding N−1 subintervals to derive an interval demand over N contiguous subintervals. The interval demand is compared to a previously recorded maximum demand and, if the interval demand exceeds the maximum demand, its value is substituted for the maximum demand for use in subsequent comparisons. The processor employs volatile memory. A non-volatile memory is provided for storing the billing data and programmed constants in the event of an impending power outage. A power monitor detects the possibility of an impending power outage and, operating on stored energy, both enables and powers the transfer of data to the non-volatile memory. When power is resumed, the power monitor enables resetting the processor and retransferring the data from the non-volatile to the volatile memory for resumption of demand metering. A grace period is provided after the resumption of power before beginning demand metering to permit the energy user's starting loads to pass before demand metering begins. Provision is made for treating the beginning and ending of a test operating mode similar to a power outage. In addition, the demand register responds to its removal from, and its replacement in, the electric meter in a manner similar to its response to a power outage.

7 Claims, 2 Drawing Figures

ELECTRONIC DEMAND REGISTER

BACKGROUND OF THE INVENTION

The present invention relates to electric meters and, more particularly, to demand registers for electric meters.

Conventional electric meters employ an aluminum disk driven as a rotor of a small induction motor by an electric field at a speed which is prportional to the electric power being consumed by a load. Geared dials, or cyclometer discs, integrate the disk motion to indicate the total energy consumed, conventionally measured in kilowatt hours (one kilowatt hour equals one thousand watts of power consumption for one hour).

In addition to the above measurement of consumption, some electric meters contain demand registers having means for separating the consumption into those parts of consumption occurring during peak and off-peak hours (however defined) and for recording maximum demand during any one of a contiguous set of demand intervals over a predetermined period of time in order to adjust billing according to such parameters. In one such meter disclosed in U.S. Pat. No. 3,586,974, a mechanical demand register records the maximum demand during a predetermined period of time and stores the value for reading. The predetermined period of time may be, for example, the time between meter readings, or a period of time corresponding to the billing period of the utility providing the power. A clockwork mechanism restarts the demand register at the end of each demand interval which may be, for example, a fraction of an hour, so that, at the end of the predetermined period, the stored value represents the highest value of power usage occurring during any one of the demand intervals in the predetermined period.

Demand registers of the mechanical type, such as disclosed in the above U.S. Patent, have limited flexibility. Once their design is completed for a particular meter physical configuration, the design is not transferrable to a meter having a different physical configuration. Also, the demand-measurement functions cannot be redefined without major mechanical redesign.

When a power outage occurs, the clockwork motor driving the demand register is halted. Following the restoration of power, the clockwork motor driving the demand register is restarted without recognizing the fact that a power outage has occurred. There is some question whether resumption of operation can be performed in this way while strictly abiding by the regulations for demand metering as defined by the commissions having jurisdiction over the utility providing the electric power and without penalizing a customer for an apparent very high demand which is the result of the power outage and resumption and not the fault of the customer.

Maximum demand metering is conventionally defined as the maximum amount of power consumed in any one contiguous demand interval during the time interval of interest; that is, the maximum amount of power consumed in any one of the intervals of, for example, 15 minutes, 30 minutes or one hour. If the accumulation of actual usage during one of such demand intervals is paused by a power outage and then resumed, the demand accumulated at the end of the interrupted time period consists of an initial portion before the outage interruption and a final portion following the outage interruption. Not only does the intervention of the outage interruption appear to violate the definition of demand metering, but also, if the customer load includes a substantial number of motors or other devices having a large starting load compared to their running load, when power is restored, all or most of such motors and devices may be forced to go through their starting sequence at the same time. Under normal conditions, some of the customer's motors may run continuously and others may cycle on and off in an unsynchronized manner. Thus, the motor starting loads are normally distributed over time and their effect on demand metering is similarly distributed over time. As is well known, the starting load imposed by a motor is much higher than the running load. By synchronizing all or most of the customer's starting load in a single time period following restoration of power, an unnaturally high demand may be registered in that time period when, in fact, the unnaturally high demand is the result of the utility permitting a power outage to occur and not the result of the customer load producing the registered maximum demand.

In addition to the above limitations of mechanical demand metering, a useful demand metering technique known as rolling demand is not practically feasible using mechanical demand registers. In rolling demand metering, a demand interval is divided into N contiguous subintervals. The usage during each demand subinterval is summed with the demand recorded during the preceding N−1 subintervals. At the end of each subinterval, the total demand recorded is the demand for N subintervals, i.e. for the entire preceding demand interval. The maximum demand may then be taken as the maximum over any interval sensed at the end of a subinterval. The use of such rolling demand metering avoids distortion in the billing data which could otherwise occur due to short-term extremes in the usage data which would otherwise become lost in the averaging process over an entire demand interval.

Greater flexibility in demand metering may be obtainable using electronic acquisition, integration and processing of power usage. An electronic processor such as, for example, a microprocessor, may be employed to manage the acquisition, storage, processing and display of the usage and demand data. U.S. Pat. Nos. 4,179,654; 4,197,582; 4,229,795; 4,283,772; 4,301,508; 4,361,872 and 4,368,519, among others, illustrate the flexibility that electronic processing brings to the power and energy usage measurement. Each of these electronic measurement devices includes means for producing an electronic signal having a characteristic such as, for example, a frequency or a pulse repetition rate, which is related to the rate of power usage. The electronic processor is substituted for the mechanical demand register of the prior art to keep track of the demand during defined periods of time.

An electronic processor of an electronic demand register conventionally employs volatile random access memory for the high speed and low power consumption characteristics offered by such devices. When a power outage occurs, if steps are not taken to prevent it, all data in such volatile storage may be lost. This could include both prior demand data as well as a sense of where, in a time period, the outage occurred. The loss of demand data has an obvious negative impact on billing. The loss of time sense would require that all users in the area affected by the power outage must begin a new time period for accumulation of demand. Such synchronization of demand metering is considered undesirable by at least some utilities. U.S. Patent application Ser. No. 599,736 filed on the same date as the present application, the disclosure of which is herein incorporated by reference, discloses means for storing data in non-volatile memory when a power outage occurs and for ignoring or tolerating certain normal deviations of the line power, such as, for example, momentary overvoltage, surges, noise and momentary power outages enduring for a very short time period. This new capability to store demand billing data and programmed constants in non-volatile memory permits re-thinking the manner in which demand data accumulated before and after an outage interruption may be handled so as to provide fairness both to the consumer and to the utility.

OBJECTS AND SUMMARY OF THE INVENTION

Accordingly, it is an object of the invention to provide an electronic demand register for an electric meter which overcomes the drawbacks of the prior art.

It is a further object of the invention to provide an electronic demand register of the type employing a digital processor and a random access memory which includes means for storing volatile data in a non-volatile storage medium during periods when the integrity of the data may otherwise be threatened and for retrieving the data from the non-volatile storage medium and resuming normal operation following the threatening condition in a manner which retains relevant billing data accumulated before the threatening condition occurred.

Briefly stated, the present invention provides an electronic demand register having a processor for calculating a demand in a demand subinterval. At the end of each demand subinterval, the calculated demand is summed with the demand in the preceding $N-1$ subintervals to derive an interval demand over N contiguous subintervals. The interval demand is compared to a previously recorded maximum demand and, if the interval demand exceeds the maximum demand, its value is substituted for the maximum demand for use in subsequent comparisons. The processor employs volatile memory. A non-volatile memory is provided for storing the billing data and programmed constants in the event of an impending power outage. A power monitor detects the possibility of an impending power outage and, operating on stored energy, both enables and powers the transfer of data to the non-volatile memory. When power is resumed, the power monitor enables resetting the processor and retransferring the data from the non-volatile to the volatile memory for resumption of demand metering. A grace period is provided after the resumption of power before beginning demand metering to permit the energy user's starting loads to pass before demand metering begins. Provision is made for treating the beginning and ending of a test operating mode similar to a power outage. In addition, the demand register responds to its removal from, and its replacement in, the electric meter in a manner similar to its response to a power outage. In this manner, when the demand register is removed from the electric meter, the billing and other data is safely stored in the non-volatile memory, from which it can be copied, to a replacement demand register. When the original or replacement demand register is replaced in the electric meter, the demand register treats the replacement in the same manner that it treats the resumption of power following a power outage.

According to an embodiment of the invention, there is provided a demand register for an electric meter comprising a processor, means in the processor for calculating a rolling demand including means for summing a demand in a subinterval with demands in a preceding $N-1$ subintervals to derive an interval demand over N contiguous subintervals, means for storing a maximum demand, means for replacing the maximum demand with the interval demand if the interval demand exceeds the maximum demand, the processor including a volatile memory, a non-volatile memory, means responsive to a predetermined reduction in a voltage fed to the electric meter for enabling a first transfer of at least the maximum demand and a plurality of programmed constants from the volatile memory to the non-volatile memory, means responsive to a predetermined restoration in a voltage fed to the electric meter for enabling a second transfer of the maximum demand and the plurality of constants from the non-volatile memory to the volatile memory and means for resuming operation of the demand register following the second transfer at a time in a first subinterval corresponding to a time at which a prior subinterval was interrupted by the first transfer.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

The present invention is a demand metering system whose detailed functions are performed by a number of elements which represent separate inventions and for which U.S. Patent Applications have been filed on the same date as the filing of the present application. Since the detailed disclosures of the elements making up the system are fully detailed in their respective patent applications, the present application omits the full detail but provides reference to the individual applications for such detail. Instead of presenting the full detail, the present application summarizes the disclosures of each of the applications to the extent required for an understanding of the system being disclosed herein.

Although the present invention may be adapted to any suitable style of electric meter which employs an element rotating at a speed proportional to power consumption, including, for example, single phase or polyphase meters with one or more current and voltage coils, for concreteness, the detailed description which follows is directed toward an illustrative example of a 2-wire single phase meter of the type having a single current coil and a single voltage coil.

Figure 1:
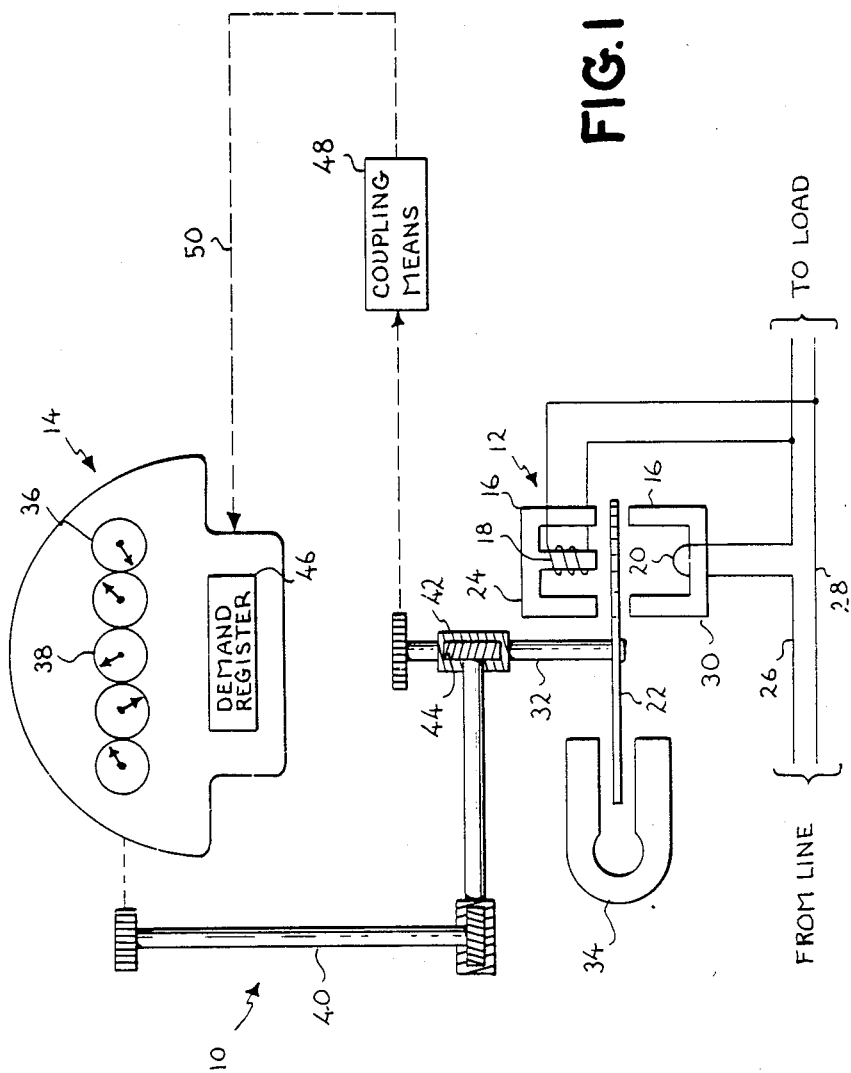
FIG. 1 is a schematic diagram of an electric meter to which the present invention may be applied.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 upon which is wound a large number of turns of fine wire. Voltage coil 18 is connected across lines 26 and 28 which feed power to a load (not shown). Current coil 20 employs a core 30 upon which a small number of turns, typically two or more, of heavy conductor are wound. Current coil 20 is connected in series with the power being fed to the load on line 26.

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force which is proportional to the rotational speed of disk 22. The rotational torque produced by voltage coil 18 and current coil 20 combined with the retarding torque produced by permanent magnet 34 is effective to rotate disk 22 at a speed which is proportional to the product of the voltage and the current; that is, the power, consumed by the load.

Register 14 includes a watthour register 36 which may include, for example, a plurality of dials 38 which are suitably geared and driven by a mechanical coupling 40 in proportion to the rotation of shaft 32. In the embodiment shown, mechanical coupling 40 includes a worm 42, which may be integrally formed in shaft 32, engaging and rotating a worm gear 44. Additional elements may be present in mechanical coupling 40 for coupling the rotation of worm gear 44 to watthour register 36 with or without change in speed and direction according to the design of the particular electric meter 10. As is conventional, watthour register 36 totals the number of revolutions of shaft 32, suitably scaled by the gear ratios employed, for billing purposes.

A demand register 46, shown schematically as a box in FIG. 1, is also connected by a suitable coupling means 48 to respond to the rotation of shaft 32. In the prior art, demand register 46 is conventionally a mechanical register having dials, or other indicating devices (not shown), and coupling means 48 is conventionally a mechanical arrangement including shafts and gearing driven by rotation of shaft 32. The dials, or indicating devices, in the mechanical embodiment of demand register 46 are urged forward for a fixed demand interval by a pusher mechanism (not shown). The pusher mechanism is reset and restarted at the end of each of the demand intervals, leaving the indicating devices with an indication proportional to the power usage (the demand) during the demand interval. The indication on the indicating devices at any time is, therefore, the maximum demand which has occurred during any one of the demand intervals since the last time the indicating devices were reset. The recorded maximum demand is employed in billing.

When a power outage occurs, the timing motor driving the gearing of mechanical demand register 46 is halted at whatever stage in the demand interval and at whatever demand readings existed on demand register 46 at the time the power outage occurred. At the end of the power outage, the timing motor again begins driving the gear train and dials from the positions they had at the beginning of the power outage and demand metering is resumed from the same position within the demand interval as existed at the beginning of the power outage. This practice may fail to rigorously satisfy the definition of demand metering and may also impose an unfair burden on the user. This system does have the one desirable feature, however that, since the demand metering picks up at the same point in the demand interval that it had when the outage occurred, it proceeds to complete the demand interval and thus a power outage does not have the effect of synchronizing all of the demand registers in the affected area.

In the present invention, demand register 46 is an electronic demand register.

Figure 2:
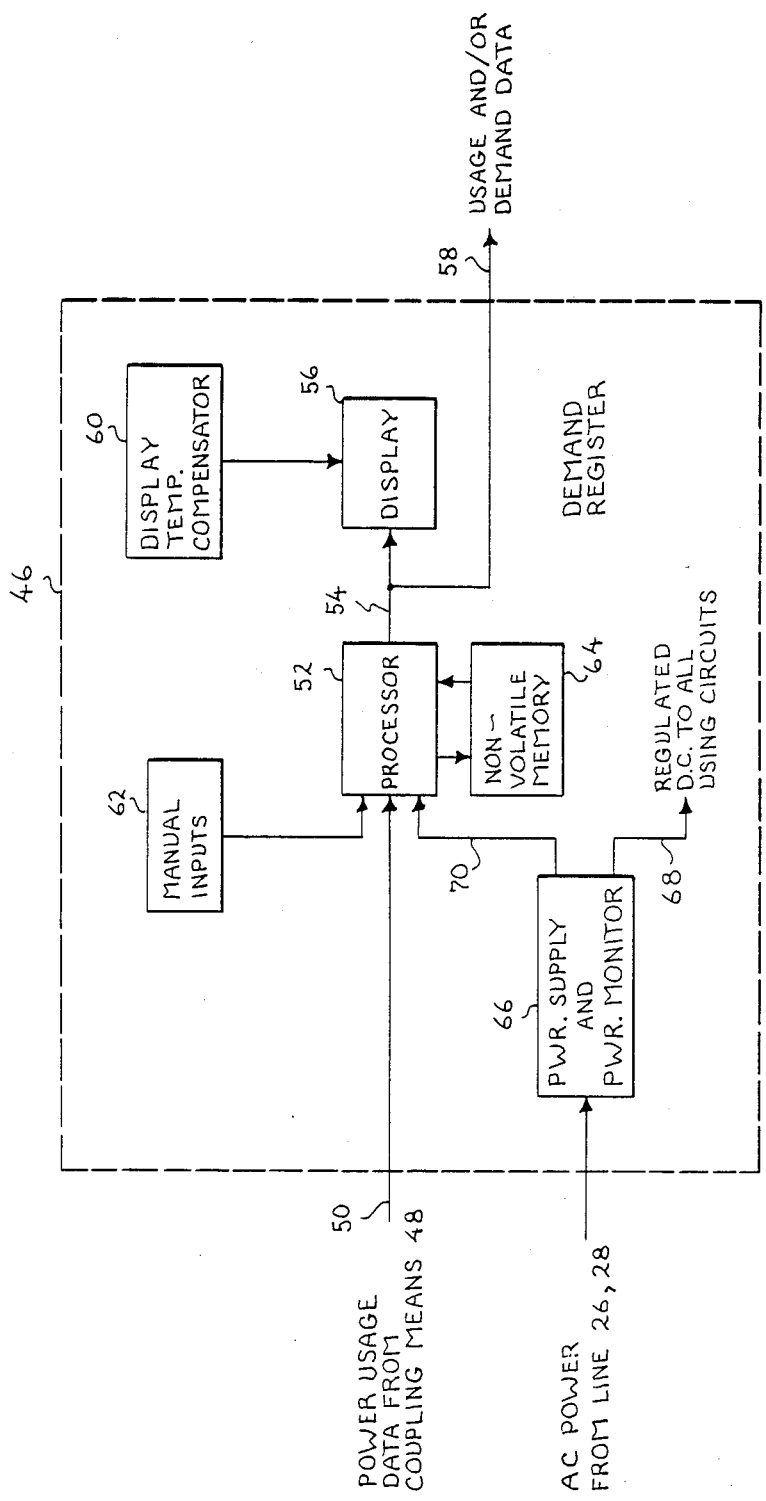
FIG. 2 is a block diagram of a demand register of FIG. 1 according to an embodiment of the invention.

Referring to FIG. 2, there is shown a simplified block diagram of a demand register 46 according to an embodiment of the invention. For present purposes, it is sufficient to note that the signal related to power usage fed from coupling means 48 to demand register 46 is an electronic signal having a characteristic such as, for example, a frequency or pulse repetition rate, which is variable in dependence on the rate of power usage. Any suitable electronic signal generating apparatus, such as, for example, an apparatus such as one of those disclosed in the reference prior patents or in U.S. Patent Application Ser. No. 550,142 filed Nov. 10, 1983, may be employed to produce a power usage signal which is applied on a line 50 to a processor 52 in demand register 46.

Processor 52 appropriately performs calculations on the usage data, such as, for example, counting pulses and scaling, to derive desired demand parameters and stores the result. In particular, processor 52 performs rolling demand metering as more fully detailed in U.S. Patent Application Ser. No. 599,742 filed on the same date as the present application, the disclosure of which is herein incorporated by reference. Briefly described, rolling demand metering divides a demand interval into N equal demand subintervals. The demand is accumulated over the current subinterval and, at the end of the current subinterval, the demand in the just-completed subinterval is summed with the demands in the preceding $N-1$ demand subintervals to derive a current demand interval value. The current demand interval value is compared with a previously stored maximum demand and, if the current demand interval value exceeds the previous maximum demand, the previous maximum demand is replaced with the current demand interval value.

Rolling demand metering, as summarized above, and as fully detailed in the referenced Patent Application, avoids losing revenue such as may occur by the use of a large demand interval which tends to average out actual peaks in demand, and also avoids distortion in demand data which may occur due to fortuitous straddling of a demand peak over an end of one demand interval and the beginning of the next demand interval.

In addition to calculating and recording demand, processor 52 may provide an output on a line 54 suitable for driving a display 56. The stored data may be transmitted on a line 58 to a remote location (not shown) for further analysis and/or billing.

Due to the extremes of environment in which electric meters may be used, display 56 may need special compensation for environmental parameters. Such special compensation may include a display temperature compensator 60 whose detailed structure and operation are fully disclosed in U.S. Patent Application Ser. No. 599,744 filed on the same date as the present application, the disclosure of which is herein incorporated by reference. For the present application, it is sufficient to note that a threshold voltage exists for turning liquid crystal display elements on and off. This threshold voltage is non-linearly dependent on temperature. Display temperature compensator 60 is operative to control a set of supply voltages fed to display 56 in a non-linear relationship to temperature in a manner which generally tracks the non-linear temperature dependence of the threshold voltage.

As previously noted, processor 52 conventionally employs volatile random access memory elements which lose any data stored in them in the event of a power outage. This is usually not acceptable in an electric meter where such loss of usage and/or demand data has a negative financial impact on the utility supplying the electric power. Non-volatile storage elements such as, for example, electrically erasable programmable read only memory elements, are well known for use with processor 52. However, such non-volatile storage elements normally have relatively slow write and erase times on the order of 10 or 20 milliseconds. This is too slow for most applications. Besides this drawback, the power required to erase and write such memory elements is quite high compared to that required by volatile memory elements of processor 52. Finally, a wear-out mechanism in electrically erasable programmable read only memory cells limits the number of times they can be erased and re-recorded. About 10,000 cycles of write and erase brings such a memory element to the end of its reliable useful life. The volatile memory elements in processor 52 must, of course, be written and erased many thousands of times a day. Thus, an electrically erasable programmable read only memory would have a very short life as the operating memory for processor 52.

In order to provide safe storage for data and/or programmed constants during a power outage or during test operation, a conventional non-volatile memory 64 is provided into which such data and constants can be written and from which the data and constants can again be read upon restoration of normal conditions. In their role in non-volatile memory 64, electrically erasable programmable read only memory elements are erased and rewritten only when a relatively serious power outage occurs and possibly during a relatively small number of test cycles. Such operations are not expected to occur on a frequent enough basis in demand register 46 of electric meter 10 to represent a limit on the life of the register.

An incompatibility exists between the protocols required for transmitting and receiving data between some commercially available types of processor 52 and non-volatile memory 64. In order to adjust the protocols of the two devices, processor 52 formats an output message for transmission to non-volatile memory 64 in a manner which fools non-volatile memory 64 into recognizing a received word as one having the correct protocol. Similarly, processor 52 operates on a message received from non-volatile memory 64 using appropriate shift techniques to align the data in the received message into a format which processor 52 can accept. A full disclosure of the apparatus and functions involved in performing the above memory interface is contained in U.S. Patent Application Ser. No. 599,683 filed on the same date as the present application, the disclosure of which is herein incorporated by reference.

A power supply and power monitor 66 receives AC power from lines 26 and 28 for the production of a regulated DC voltage which is applied on a line 68 to all circuits in demand register 46 requiring such power. In addition to producing regulated DC power, power supply and power monitor 66 also monitors the condition of the AC power on lines 26 and 28 and, in response to detected conditions indicating the possibility an impending power outage or the actuality of such a power outage, applies an emergency store signal on a line 70 to processor 52 which controls the transfer of data from processor 52 to non-volatile memory 64 in the event of an apparent power outage and resets processor 52 in the event of an actual power outage. Prior to transferring the data and programmed constants to non-volatile memory 64, processor 52 checks to determine whether the demand during the current interval up to the time of the power outage exceeds the maximum demand previously recorded. If the demand in the current interval does exceed the maximum demand, the demand for the current interval is substituted for the maximum demand and the thus-modified data is transmitted to non-volatile memory 64 for storage. Upon restoration of power, power supply and power monitor 66 applies a reset signal signal on line 70 to processor 52 for initiating the sequence for resuming demand metering, as will be explained. A full disclosure of the structure and function of power supply and power monitor 66 is contained in U.S. Patent Application Ser. No. 599,736, filed on the same date as the present application, the disclosure of which is herein incorporated by reference.

Resumption of demand metering following a power outage is desirably performed to accomplish the following objectives:

1. A grace period should be provided for permitting the energy user's motor starting loads, and other load peaks which are due totally or principally by the power outage, to be completed before demand metering is begun. This avoids penalizing energy users for peak loads which are caused by the power outage and not by their intentional creation of peak demand.
2. A new partial demand subinterval should be begun following the grace period at a point in a partial demand subinterval corresponding to the point where the prior subinterval was interrupted by the power outage. This avoids synchronizing demand intervals and subintervals throughout the area affected by the power outage.
3. A new demand interval should be begun simultaneously with the new demand subinterval with demands in the prior N−1 subintervals set to zero.
4. The previously stored value of maximum demand should be re-stored for comparison with the ongoing interval demands.

The preceding objectives are achieved in processor 52 in cooperation with power supply and power monitor 66 and non-volatile memory 64 in the manner fully disclosed in U.S. Patent Application Ser. No. 599,743 filed on the same date as the present application, the disclosure of which is herein incorporated by reference.

It is desirable to provide means for testing demand register 46 in the shop or in the field without compromising stored billing data and programmed constants. A manual input 62 is provided for suitably changing the functional of demand register 46 by applying an appropriate signal to processor 52. When test operation is begun, processor 52 responds to it as though a power outage were occurring. That is, processor 52 checks to determine whether the present interval demand exceeds the maximum demand and, if it does, stores the present interval demand as the new maximum demand, and then transfers subinterval timing, maximum demand and programmed constants to non-volatile memory 64. This permits test operation of processor 52 under control of, for example, switches in manual input 62 to manipulate the data in processor 52 and to provide for display of data on display 56 which is not displayed during normal use of demand register 46. At the end of test operation, normal operation is resumed in a manner identical to the manner of resumption of operation following a power outage. That is, demand accumulation is begun during a partial subinterval, a new demand interval is begun with demand in the prior N−1 subintervals set to zero and the previous maximum demand and the programmed constants are retrieved from non-volatile memory 64 and re-stored in processor 52 for use as previously described. Test operation of demand register 46 is fully disclosed in U.S. Patent Application Ser. No. 599,735 filed on the same date as the present application, the disclosure of which is herein incorporated by reference.

In order to adapt demand register 46 of the present invention to as wide a range of electric meters as possible, a single electronic design is employed. The programmed constants which are employed in processor 52 customize processor 52 for the particular style of electric meter 10 in which it is installed and for the particular customer installation. The programmed constants are stored in non-volatile memory 64 using a conventional, or especially adapted, EEPROM programmer before demand register 46 is installed in electric meter 10. When demand register 46 is installed and connected to a power line, a power-up sequence identical to that performed after a power outage, and previously described herein, is performed. That is, the programmed constants are read into processor 52 and demand metering is begun in the manner described.

In the case of equipment failure in the field, one convenient troubleshooting method employs the substitution of a replaceable module for a module which may be defective. Such a troubleshooting method is foreseen for use with the system of the present invention. Such a troubleshooting method raises the problem of defining a practical way of copying the unique set of programmed constants and billing data from a non-volatile memory 64 in a demand register 46 being replaced into a non-volatile memory 64 of a replacement demand register 46. This copying function is performed in a programmer (not shown) which reads out the data from a non-volatile memory 64 when its demand register 46 has been removed from the circuit, temporarily stores this data, and then copies the temporarily stored data into non-volatile memory 64 in the replacement unit. This copying function is enabled by the manner in which demand register 46 responds to the apparent loss of power and its resumption. That is, when demand register 46 is removed from electric meter 10, power supply and power monitor 66 senses this as a power outage and stores the described data in non-volatile memory 64 from which it can be read using the programmer. When power is restored to the replacement demand register 46, power supply and power monitor 66, processor 52 and non-volatile memory 64 respond as though to a normal resumption of power following a power outage. That is, billing data and programmed constants are transferred from non-volatile memory 64 to processor 52 and the described post-power-outage sequence is followed. Since the particular programmer used to read, temporarily store and to copy the data from a non-volatile memory 64 being replaced to the replacement element may be conventional, a full description and illustration thereof is omitted from the present disclosure. A full disclosure of the apparatus and method for the copying function is provided in U.S. patent application Ser. No. 599,685 filed on the same date as the present application and the disclosure of which is herein incorporated by reference.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A demand register for an electric meter comprising:
   a processor;
   means in said processor for calculating a rolling demand including means for summing a demand in a subinterval with demands in a preceding N-1 subintervals to derive an interval demand over N contiguous subintervals;
   means for storing a maximum demand;
   means for replacing said maximum demand with said interval demand if said interval demand exceeds said maximum demand;
   said processor including a volatile memory;
   a non-volatile memory;
   means responsive to a predetermined reduction in a voltage fed to said electric meter for enabling a first transfer of at least said maximum demand, a value representing a time at which a subinterval is interrupted by said predetermined reduction in said voltage and a plurality of programmed constants from said volatile memory to said non-volatile memory;
   means responsive to a predetermined restoration in a voltage fed to said electric meter for enabling a second transfer of said maximum demand, said value and said plurality of constants from said non-volatile memory to said volatile memory; and
   means for resuming operation of said demand register following said second transfer at a time in a first subinterval corresponding to a time represented by said value.

2. A demand register according to claim 1 wherein said means for resuming operation includes means for providing a grace period following said second transfer during which a start of demand metering is delayed.

3. A demand register according to claim 1, further comprising means for changing a functional operation of said demand register between a first operation and a second operation, said means for changing a functional operation including means for enabling said first transfer in response to changing said functional operation from said first operation to said second operation and for enabling said second transfer in response to changing said functional operation from said second operation to said first operation.

4. A demand register according to claim 3 wherein said means for resuming operation includes means for providing a grace period following said second transfer during which a start of demand metering is delayed.

5. A demand register according to claim 1 wherein a data protocol for communication between said volatile memory and said non-volatile memory is incompatible, further comprising:
   formatting a first data message for transmission from said volatile memory to said non-volatile memory containing at least a leading portion which said non-volatile memory ignores, a remainder of said first data message including a data protocol which said non-volatile memory is capable of accepting; and processing a second data message received in said volatile memory from said non-volatile memory by at leasst a selective shift and an ignoring of at least part of said second data whereby a remainder of said second data message includes a data protocol which said volatile memory is capable of accepting.

6. A demand register according to claim 1 further comprising:

means for copying data from a non-volatile memory of a first demand register which has been removed from said electric meter to a second demand register before it is installed in said electric meter;

said means for copying including means in said first demand register for recognizing a removal of said first demand register as the equivalent of an impending power outage and for transferring data from said volatile memory to a first non-volatile memory in said first demand register:

said means for copying further including a programmer;

said programmer including means for reading a content of said first non-volatile memory and for temporarily storing said content;

said programmer further including means for writing said content into a second non-volatile memory in said second demand register; and means in said demand register for recognizing an installation of said second demand register in said electric meter as the equivalent of a resumption of said voltage to said electric meter whereby said second transfer from said non-volatile memory to said volatile memory is performed and normal operation of said electric meter including said second demand register is resumed.

7. A demand register for an electric meter comprising:

a processor;

means in said processor for calculating a rolling demand including means for summing a demand in a subinterval with demands in a preceding N-1 subintervals to derive an interval demand over N contiguous subintervals;

means for storing a maximum demand;

means for replacing said maximum demand with said interval demand if said interval demand exceeds said maximum demand;

said processor including a volatile memory;

a non-volatile memory;

means responsive to a predetermined reduction in a voltage fed to said electric meter for enabling a first transfer of at least said maximum demand, a value representing a time at which a subinterval is interrupted by said predetermined reduction in said voltage and a plurality of programmed constants from said volatile memory to said non-volatile memory;

means responsive to a predetermined restoration in a voltage fed to said electric meter for enabling a second transfer of said maximum demand, said value and said plurality of constants from said non-volatile memory to said volatile memory;

means for resuming operation of said demand register following said second transfer at a time in a first subinterval corresponding to a time represented by said value;

means for changing a functional operation of said demand register between a first operation and a second operation;

said means for changing a functional operation including means for enabling said first transfer in response to changing said functional operation from said first operation to said second operation and for enabling said second transfer in response to changing said functional operation from said second operation to said first operation;

said means for resuming operation including means for providing a grace period following at least some of said second transfers during which a start of demand metering is delayed;

a data protocol for communication between said volatile memory and said non-volatile memory being incompatible;

means for formatting a first data message for transmission from said volatile memory to said non-volatile memory containing at least a leading portion which said non-volatile memory ignores, a remainder of said first data message including a data protocol which said non-volatile memory is capable of accepting;

means for processing a second data message received in said volatile memory from said non-volatile memory by at least a selective shift and an ignoring of at least part of said second data whereby a remainder of said second data message includes a data protocol which said volatile memory is capable of accepting;

means for copying data from a non-volatile memory of a first demand register which has been removed from said electric meter to a second demand register before it is installed in said electric meter;

said means for copying including means in said first demand register for recognizing a removal of said first demand register as the equivalent of an impending power outage and for transferring data from said volatile memory to a first non-volatile memory in said first demand register;

said means for copying further including a programmer;

said programmer including means for reading a content of said first non-volatile memory and for temporarily storing said content;

said programmer further including means for writing said content into a second non-volatile memory in said second demand register;

and means in said second demand register for recognizing an installation of said second demand register in said electric meter as the equivalent of a resumption of said voltage to said electric meter whereby said second transfer from said non-volatile memory to said volatile memory is performed and normal operation of said electric meter including said second demand register is resumed.

* * * * *